United States Patent

Joo

[11] Patent Number: 5,838,632
[45] Date of Patent: Nov. 17, 1998

[54] SEMICONDUCTOR MEMORY APPARATUS

[75] Inventor: Yang Sung Joo, Seoul, Rep. of Korea

[73] Assignee: LG Semicon Co., Ltd., Choongcheongbuk-Do, Rep. of Korea

[21] Appl. No.: 956,355

[22] Filed: Oct. 23, 1997

[30] Foreign Application Priority Data

Oct. 25, 1996 [KR] Rep. of Korea ............ 1996 48240

[51] Int. Cl.⁶ ........................................ G11C 7/00
[52] U.S. Cl. ............ 365/239; 365/230.06; 365/230.08; 365/189.01
[58] Field of Search .............. 365/239, 230.06, 365/230.08, 189.01, 189.02, 189.05

[56] References Cited

U.S. PATENT DOCUMENTS 5,257,237 10/1993 Aranda et al. ..................... 365/239
5,500,825 3/1996 Onaya et al. ..................... 365/239

*Primary Examiner*—Vu A. Le
*Attorney, Agent, or Firm*—Morgan, Lewis & Bockius LLP

[57] ABSTRACT

An improved semiconductor memory apparatus which is capable of an increased data transmission ratio. The apparatus includes a memory array for storing data, a plurality of input/output pads and a data bus connected between data input/output pads for inputting/outputting the data stored in an external element and the memory array data is transferred between the input/output pads and first and second buffers in a time interval manner over basis of width N and between the memory array and the first and second buffer over a bus of width 2N.

2 Claims, 3 Drawing Sheets

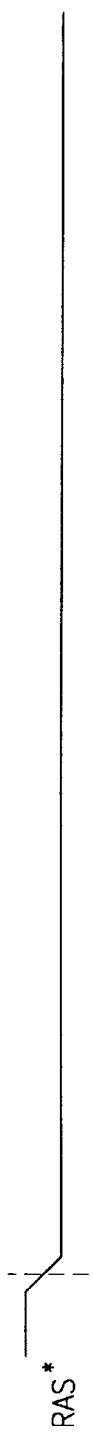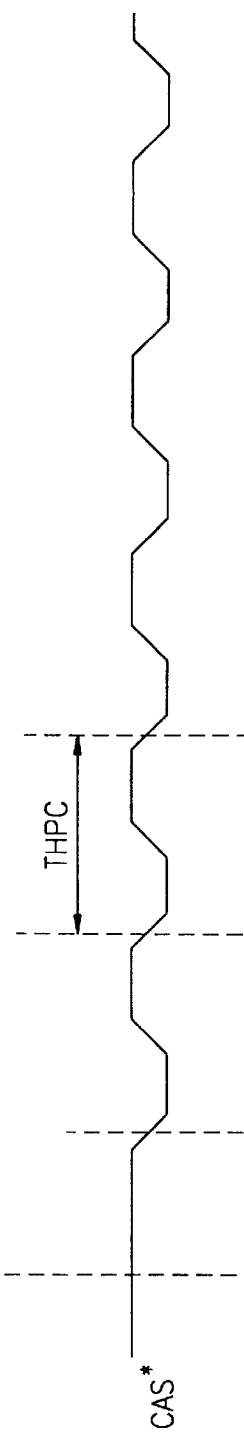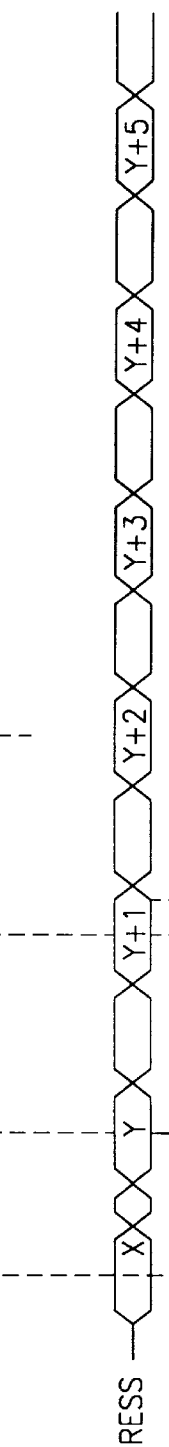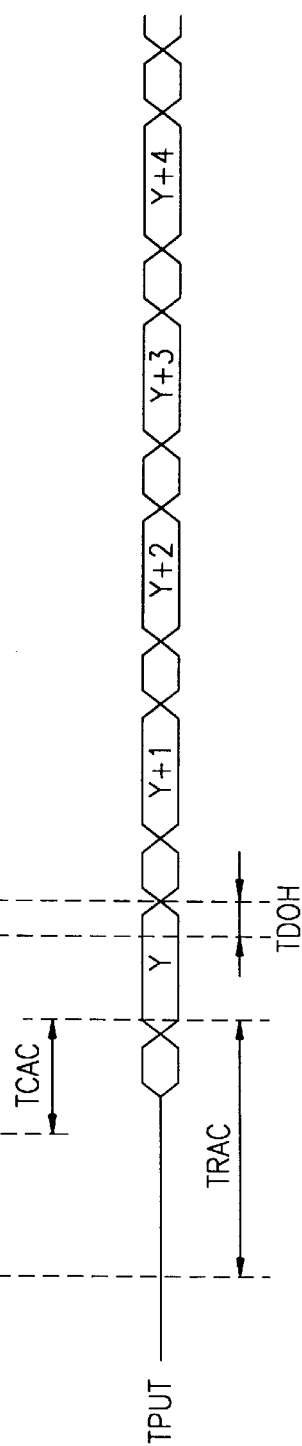
FIG. 1A CONVENTIONAL ART
FIG. 1B CONVENTIONAL ART
FIG. 1C CONVENTIONAL ART
FIG. 1D CONVENTIONAL ART

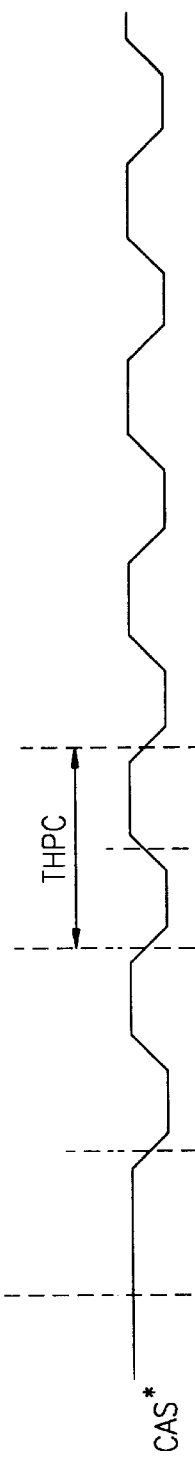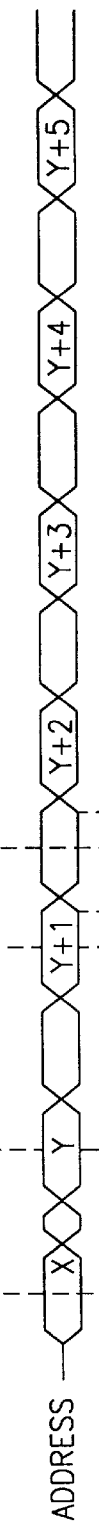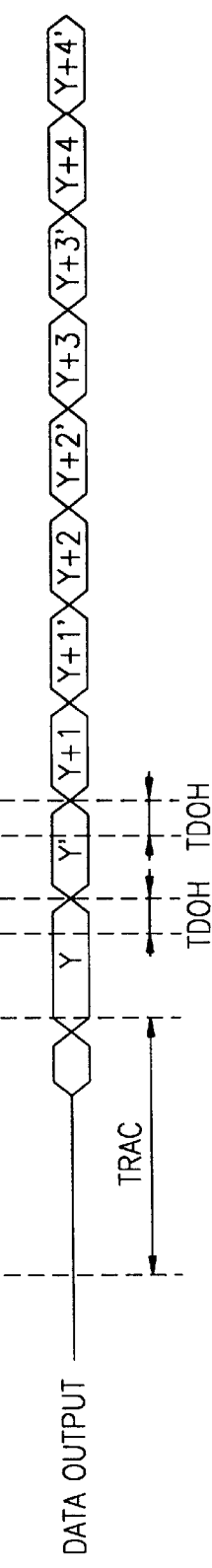
FIG. 3A  RAS*
FIG. 3B  CAS*
FIG. 3C  ADDRESS
FIG. 3D  DATA OUTPUT

SEMICONDUCTOR MEMORY APPARATUS

This application claims the benefit of Korean Application No. 48240/1996 filed on Oct. 25, 1996, which is hereby incorporated by reference

BACKGROUND OF THE INVENTION

1. Field of the Invention

The present invention relates to a semiconductor memory apparatus, and in particular to an improved semiconductor memory apparatus with an increased data transmission ratio.

2. Description of the Conventional Art

Semiconductor memories with large capacities and high speeds are important elements for high speed systems. Since the introduction of 1 K bit DRAM (Dynamic Random Access Memory), the semiconductor memory has been developed to have large integration and high speed. Recently, 64 Mbit and 256 Mbit semiconductor memories have been intensively studied.

For the above-described large integration and capacity semiconductor memory devices, low power consumption ratio, high speed data processing, wide range operational margin, and low price are important factors.

Among various type semiconductor memories, a fast page mode semiconductor memory is widely used. The column address strobe (CAS) basically receives a column address. In the fast page mode, it is possible to reduce the pre-charge time of the CAS, in order to increase the data transmission speed.

In addition, another technique is an extended data output mode (EDO). The operational principle thereof will now be explained with reference to FIGS. 1A to 1D.

As shown in FIG. 1A, when a row address strobe /RAS (RAS: Row Address Strobe) is enabled, an X-address is received. As shown in FIG. 1B, when the column address strobe /CAS (CAS: Column Address Strobe) is low-enabled, a Y-address is received. In addition, a specific cell portion of a memory is accessed by using the received address. As shown in FIG. 1D, the data output maintains an effective value even when the column address strobe is high-enabled.

Namely, it is possible to reduce a hyper page mode cycle time (THPC) more than in the fast page mode in cooperation with the data which exists within the range in which the column address strobe is disabled.

In addition, there is another method for increasing the data transmission ratio by increasing the number of pins of the DRAM for high speed processing of data. For example, when comparing 16 I/O and 32 I/O with the following expressions, it is possible to increase the data transmission ratio by increasing the number of pins.

(1) 16 I/O:57.2 Mbyte/sec=2 byte*($1/35$ nsec $\Diamond$)=2*28.6 M (2) 32 I/O:114.4 Mbyte/sec=4 byte*($1/35$ nsec $\Diamond$)=4*28.6 M (where $\Diamond$ is 35n TPC (Access Time from /CAS) in the case of 50n TRAC (Access time from /RAS)

However, when using the EDO mode, the speed becomes faster compared to the fast page mode. However, the speed of the EDO mode is too slow compared to the cycle speed of the CPU (Central Processing Unit). In addition, there is a lack of compatibility between the SDRAM (synchronous DRAM) and the DRAM. In accordance with expressions (1) and (2) above, it is possible to double the data transmission ratio by doubling the number of pins compared to the number of pins as described in expression 1. If this is done, however, the chip size is disadvantageously increased.

As described above, in the conventional semiconductor memory apparatus it is impossible to increase the data transmission ratio, and the compatibility between memory devices is low. In addition, when increasing the number of pins so as to overcome the above-described problems, the chip size is disadvantageously increased.

SUMMARY OF THE INVENTION

Accordingly, it is an object of the present invention to provide a semiconductor memory apparatus that overcomes the aforementioned problems encountered in the conventional art.

It is another object of the present invention to provide an improved semiconductor memory apparatus that is capable of increasing the data transmission ratio.

To achieve the above objects, there is provided a semiconductor memory apparatus which includes a memory array for storing data, and a data bus connected between data input/output pads for inputting/outputting the data stored in an external element and the memory array and the data to be stored by the n number, communicating at least 2n data with the memory array, and communicating at least 2n data with the data input/output pad by the n number by a time interleaving method during the same duration.

Additional advantages, objects and features of the invention will become more apparent from the description which follows.

BRIEF DESCRIPTION OF THE DRAWINGS

The present invention will become more fully understood from the detailed description given hereinbelow and the accompanying drawings, which are given by way of illustration only, and wherein:

FIGS. 1A through 1D are diagrams illustrating an operation timing of a conventional semiconductor memory apparatus;

FIGS. 3A through 3D are diagrams illustrating an operation timing of a semiconductor memory apparatus according to the present invention.

DETAILED DESCRIPTION OF THE INVENTION

Figure 2:
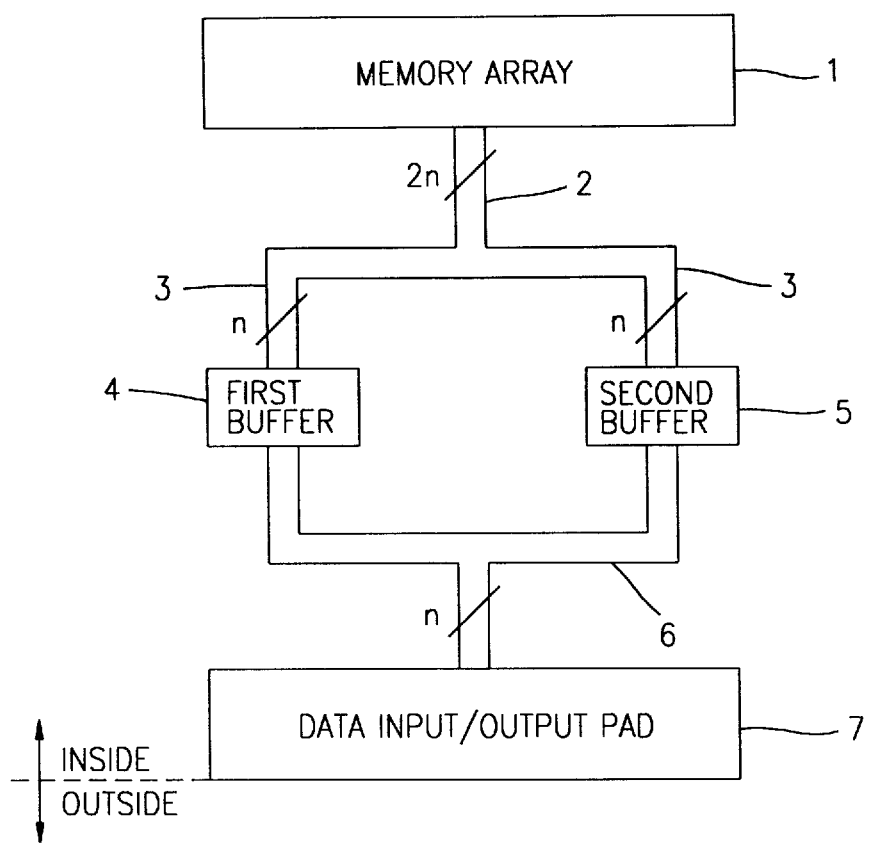
FIG. 2 is a block diagram illustrating a semiconductor memory apparatus according to the present invention.

FIG. 2 is a block diagram illustrating a semiconductor memory apparatus according to the present invention.

As shown therein, in the semiconductor memory apparatus according to the present invention, a first data bus 2 is formed to have a double width, e.g., 2n, compared to the number of data input/output pads 7, e.g., n, so as to increase the transmission ratio of data. First and second buffers 4 and 5 are arranged for connecting the data input/output pads 7 and the first data bus 2. The first data bus and memory array are designed for communicating at least 2n data. In addition, the first data bus and data input/output pads are designed for communicating at least 2n data by a time interleaved method in accordance with a column address strobe signal during the same duration.

In more detail, the semiconductor memory apparatus according to the present invention includes a memory array 1 having a plurality of memory cells, a first data bus 2 of width 2n for inputting data to be written into the memory array 1 and for outputting data used from the memory array 1 in response to an external control signal. A second data bus 3 of width n for transmitting the data from the first data bus 2 to the first and second buffers 4 and 5 in a time interleaved manner for temporarily storing the data therein. First and second buffers 4 and 5 temporarily store the data output from the second data bus 3, namely, the data being communicated between the memory array 1 and the data input/output pads 7. Data input/output pads 7 output the data from the first and second buffers 4 and 5 and input data to be stored in the first and second buffers.

The operation of the semiconductor memory apparatus according to the present invention will now be explained with reference to the accompanying drawings.

As shown in FIG. 3A, the row address strobe signal /RAS is low-activated, an X-address is received, and a word line is selected. As shown in FIG. 3C, the point in which the signal is converted from low level to high level is detected from the X-address, and an internal Y-cell is enabled. A cell data at a contact point intersecting with the word line is carried on a data line. Here, since the first data bus is at least double the width compared to the number of input/output data pads, it is possible to transfer memory cell data at a rate at best equal to two times the number of the input/output data pads.

The first data bus is divided into two data buses of, for example, 16 bits each, and is connected with the first and second buffers. For example, the data first outputted from the memory array is outputted to the first buffer, and the data next outputted from the memory array is outputted to the second buffer.

In addition, as shown in FIG. 3B, when the column address strobe signal /CAS is low-activated, the data(Y) is outputted from the first buffer through the data input/output bus 6 and the data input/output pad to the outside of the memory array (1). And then, when the column address strobe signal /CAS is high-activated, the data(Y') is outputed from the second buffer through the data input/output bus and input/output pad to the outside of the memory array (1). As shown in FIG. 3D, two data, Y and Y', are processed with respect to one Y-address.

As described above, the semiconductor memory apparatus according to the present invention doubles the capacity of the data bus compared to the number of input/output pads by outputting the data with respect to the Y-address during the drop and fall of the column address selection signal and thereby overcomes the compatibility problems. In addition, it is possible to increase the transmission ratio of data without increasing the number of pins, enabling the fabrication of a more compact apparatus, and to upgrade the system without changing the hardware.

Although the preferred embodiments of the present invention have been disclosed for illustrative purposes, those skilled in the art will appreciate that various modifications, additions and substitutions are possible, without departing from the scope and. spirit of the invention as recited in the accompanying claims.

What is claimed is:

1. A semiconductor memory apparatus, comprising:
   a memory array for storing a data;
   data input/output pads for inputting/outputting data;
   a data bus having a bus width equal to at least twice the number of input/output pads connected between the data input/output pads and the memory array in a time interleaved manner to increase the data transmission rate between the memory array and the data input/output pads; and
   a column address strobe command is low activated for strobing column address and output the first data, and then is high activatied for sequential data output.

2. The apparatus of claim 1, wherein the data bus includes:
   a first buffer and a second buffer for storing the data transferred between the memory array and the data input/output pads;
   a first data bus of width N for transferring data between the first buffer and the data input/output pads and the second buffer and the data input/output pads in a time interleaved manner;
   a second data bus of width 2N for transmitting data to and from the memory array;
   a third data bus of width N for transmitting data between the first buffer and the second data bus; and
   a fourth data bus of width N for transmitting data between the second buffer and the second data bus.

* * * * *